United States Patent [19]
Gill

[11] Patent Number: 5,920,446
[45] Date of Patent: Jul. 6, 1999

[54] ULTRA HIGH DENSITY GMR SENSOR

[75] Inventor: Hardayal Singh Gill, Portola Valley, Calif.

[73] Assignee: International Business Machines Corporation, Armonk, N.Y.

[21] Appl. No.: 09/003,414

[22] Filed: Jan. 6, 1998

[51] Int. Cl.[6] ............................................. G11B 5/39
[52] U.S. Cl. ............................................. 360/113
[58] Field of Search ..................... 360/113; 338/32 R; 324/207.21, 252

[56] References Cited

U.S. PATENT DOCUMENTS

| | | | |
|---|---|---|---|
| 5,206,590 | 4/1993 | Dieny et al. ............................ | 324/252 |
| 5,341,118 | 8/1994 | Parkin et al. ............................ | 338/32 |
| 5,408,377 | 4/1995 | Gurney et al. ............................ | 360/113 |
| 5,422,571 | 6/1995 | Gurney et al. ............................ | 324/252 |
| 5,465,185 | 11/1995 | Heim et al. ............................ | 360/113 |
| 5,528,440 | 6/1996 | Fontana et al. ............................ | 360/113 |
| 5,583,725 | 12/1996 | Coffey et al. ............................ | 360/113 |
| 5,627,703 | 5/1997 | Smith ............................ | 360/113 |
| 5,764,056 | 6/1998 | Mao et al. ............................ | 360/113 |
| 5,768,066 | 6/1998 | Akiyama et al. ............................ | 360/113 |
| 5,828,526 | 10/1998 | Kagawa et al. ............................ | 360/113 |

*Primary Examiner*—Robert S. Tupper
*Attorney, Agent, or Firm*—Paik Saber

[57] ABSTRACT

A high sensitivity MR (GMR) sensor suitable for ultra high density magnetic recording applications. The GMR sensor has two laminated free layers each comprising two AP-coupled ferromagnetic layers separated by an antiparallel coupling (APC) layer. The two free layer structures are separated by a non-magnetic, conducting spacer layer. The sense current flowing in the layers of the sensor provide the bias field to set magnetization directions. The applied magnetic field from the magnetic disk rotates one or both of the two free laminated layers due to the moment difference of the composite AP-coupled layers that form the laminated free layers. In the initial state, with zero applied field, the GMR sensor is in the high resistance state. In the final states, with either polarity applied field, the GMR sensor is in the low resistance state. A unipolar output signal is produced as the GMR sensor switches states. The GMR sensor has no pinned layer and no antiferromagnetic layer which reduces the thickness of the MR sensor substantially.

40 Claims, 6 Drawing Sheets

ULTRA HIGH DENSITY GMR SENSOR

BACKGROUND OF THE INVENTION

1. Field of the Invention

This invention relates generally to magnetic transducers for reading information signals from a magnetic medium and, in particular, to a novel structure for a giant magnetoresistance sensor suitable for ultra high density data applications and to magnetic recording systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the GMR effect (also referred to as the SV effect). In an SV sensor, one of the ferromagnetic layers, referred to as the pinned layer, has its magnetization typically pinned by exchange coupling with an antiferromagnetic (e.g., NiO or Fe—Mn) layer. The magnetization of the other ferromagnetic layer, referred to as the free layer, however, is not fixed and is free to rotate in response to the field from the recorded magnetic medium (the signal field). In the SV sensor, the SV effect varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. IBM's U.S. Pat. No. 5,206,590 granted to Dieny et al. and incorporated herein by reference, discloses an MR sensor operating on the basis of the SV effect.

FIG. 1 shows a prior art SV sensor 100 comprising end regions 104 and 106 separated from each other by a central region 102. A free layer (free ferromagnetic layer) 110 is separated from a pinned layer (pinned ferromagnetic layer) 120 by a non-magnetic, electrically-conducting spacer 115. The magnetization of the pinned layer 120 is fixed by an antiferromagnetic (AFM) layer 125. Free layer 110, spacer 115, pinned layer 120 and the AFM layer 125 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. Sensing means (a detector) 170 connected to leads 140 and 145 senses (detects) the change in the resistance due to changes induced in the free layer 110 by the external magnetic field (e.g., field generated by a data bit stored on a disk).

Another type of SV sensor currently under development is an antiparallel (AP)-pinned SV sensor. In AP-Pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-Pinned SV sensor provides improved exchange coupling of the antiferromagnetic (AFM) layer to the laminated pinned layer structure than is achieved with the pinned layer structure of the SV sensor of FIG. 1. This improved exchange coupling increases the stability of the AP-Pinned SV sensor at high temperatures which allows the use of corrosion resistant antiferromagnetic materials such as NiO for the AFM layer.

FIG. 2 shows a prior art AP-Pinned SV sensor 200 comprising end regions 204 and 206 separated from each other by a central region 202. A free layer 210 is separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic layer 222 and a second ferromagnetic layer 226 separated by an antiparallel coupling (APC) layer 224 of nonmagnetic material. The two ferromagnetic layers 222, 226 (PF1 and PF2) in the laminated AP-pinned layer structure 220 have their magnetization directions oriented antiparallel, as indicated by the arrows 223, 227 (arrows pointing into and out of the plane of the paper respectively). The AFM layer 230 is formed on a seed layer 240 deposited on the substrate 250. To complete the central region 202 of the SV sensor, a capping layer 205 is formed on the free layer 210. Hard bias layers 252 and 254 formed in the end regions 204 and 206, respectively, provide longitudinal bias for the free layer 210. Leads 260, 265 provide electrical connections for the flow of the sensing current $I_s$ from a current source 270 to the SV sensor 200. Sensing means 280 connected to leads 260, 265 senses the change in the resistance due to changes induced in the free layer 210 by the external magnetic field (e.g., field generated by a data bit stored on a disk).

Prior art AP-Pinned SV sensors use an AFM in order to pin the pinned layer magnetization, however, each AFM has a blocking temperature at which the pinning field becomes zero. If the SV sensor temperature approaches the blocking temperature, the pinned layer magnetization can change its orientation resulting in degraded SV sensor performance.

Most commonly used antiferromagnetic materials have blocking temperatures (temperature at which the pinning field reaches zero Oe) near 200 C. This means that if the temperature of the SV sensor approaches this temperature, the pinned layer magnetization can change its orientation resulting in degraded SV sensor performance.

As magnetic data storage densities increase above the 10 Gbit/IN$^2$ level, the required linear bit density becomes sufficiently high that the thickness of the active layers of the SV sensor become a limiting factor in magnetic storage file system capacity. In SV sensors using antiferromagnetic material pinning layers, the thickest component of the active layers is the antiferromagnetic layer. Therefore, significant reduction in SV sensor thickness can only be achieved by significantly reducing the antiferromagnetic layer thickness.

Therefore there is a need for a magnetoresistive sensor that eliminates the temperature limitations imposed by the blocking temperature characteristics of the commonly used antiferromagnetic materials required in prior art SV sensors for providing pinning fields. There is also a need for a magnetoresistive sensor having a significantly reduced thickness in order to meet the requirements of high areal density data.

SUMMARY OF THE INVENTION

It is an object of the present invention to disclose an improved MR sensor for providing ultra high bit density readback capability.

It is another object of the present invention to disclose an MR sensor wherein the bias field is provided by the sense current flowing in the layers of the sensor.

It is a further object of the present invention to disclose an MR sensor having two free layers each comprising two AP-coupled ferromagnetic layers separated by an antiparallel coupling (APC) layer.

It is a further object of the present invention to disclose an MR sensor having no pinned layer and no antiferromagnetic layer.

In accordance with the principles of the present invention, there is disclosed a GMR sensor having a first laminated free layer structure and a second laminated free layer structure, said first and second laminated free layer structures separated from each other by a non-magnetic, electrically conducting spacer layer. In the preferred embodiment of the invention, the laminated free layer structures each comprise a first ferromagnetic layer formed of Ni—Fe and a second ferromagnetic layer formed of Ni—Fe, said first and second ferromagnetic layers separated from each other by an antiparallel coupling (APC) layer formed of ruthenium (Ru). The first and second laminated free layer structures are separated from each other by a copper (Cu) spacer layer. The thickness of the two Ni—Fe ferromagnetic layers adjacent and in contact with the Cu spacer layer is greater than the thickness of the remaining two Ni—Fe ferromagnetic layers which are not in contact with the Cu spacer. The low magnetic coercivity of the Ni—Fe/Ru/Ni—Fe antiparallel coupled free layers allows the magnetic field from the sense current flowing in the MR sensor to initialize the orientation of the net magnetic moments of the two free layers to be antiparallel with respect to each other and perpendicular to the air-bearing surface (ABS). The antiparallel orientation of the two (first and second) laminated free layers corresponds to the high resistance state of the GMR sensor. An applied magnetic field (field from a data bit recorded on the disk) of either polarity will rotate the net magnetic moments of the two free layers to be parallel with respect to each other corresponding to the low resistance state of the GMR sensor. The change of resistance of the GMR sensor is detected and results in a unipolar output signal as the applied magnetic field switches polarity since either polarity switches the GMR sensor to its low resistance state.

The absence of an antiferromagnetic and pinned layers in this MR sensor allows a significant reduction in sensor thickness compared to conventional SV sensors which makes the present invention compatible with high areal density applications. Elimination of the antiferromagnetic layer and need for track edge stabilization in the present MR sensor leads to significantly improved sensitivity compared to conventional SV sensors for submicron track widths.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
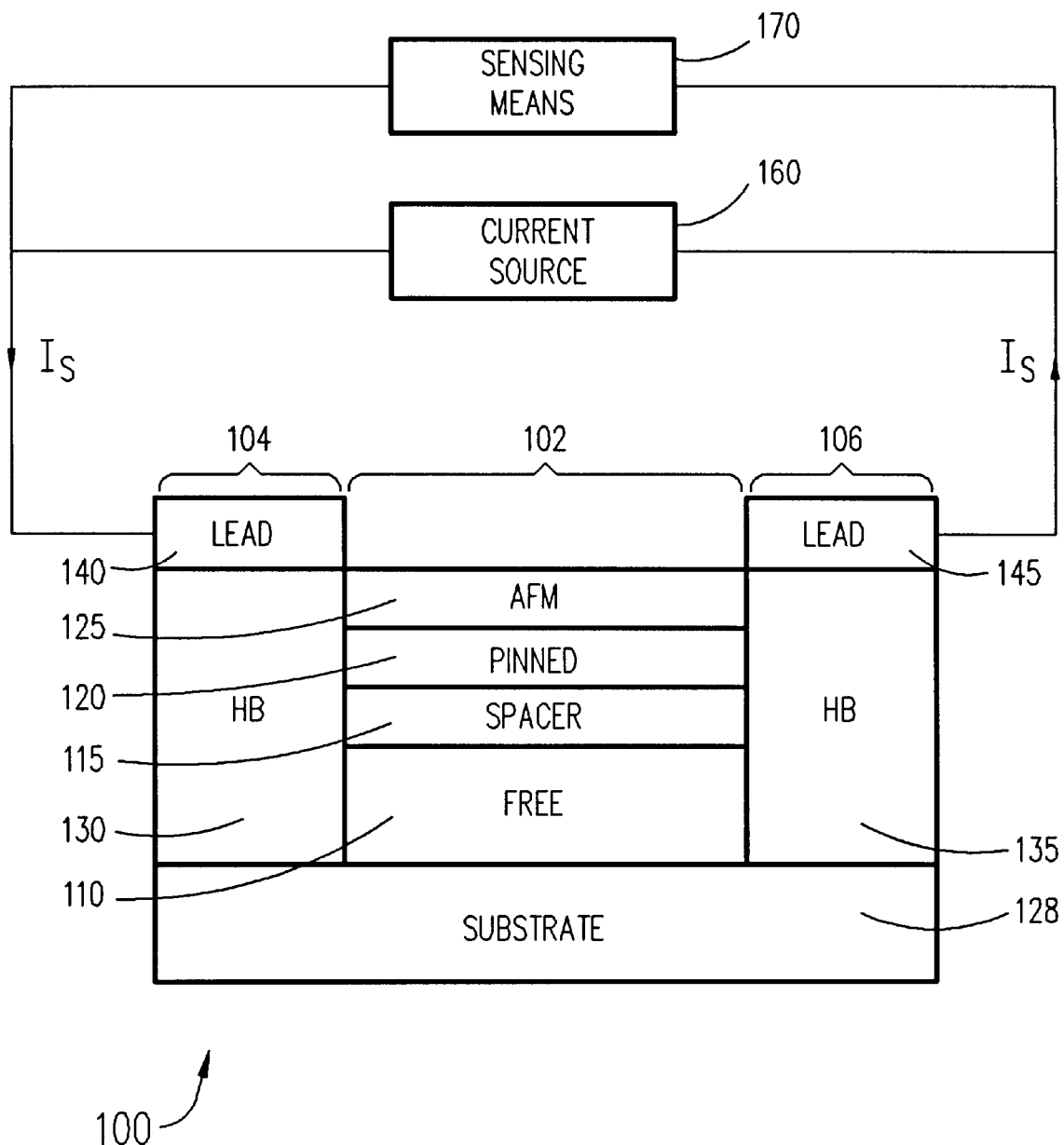
FIG. 1 is an air bearing surface view, not to scale, of a prior art SV sensor.
Figure 2:
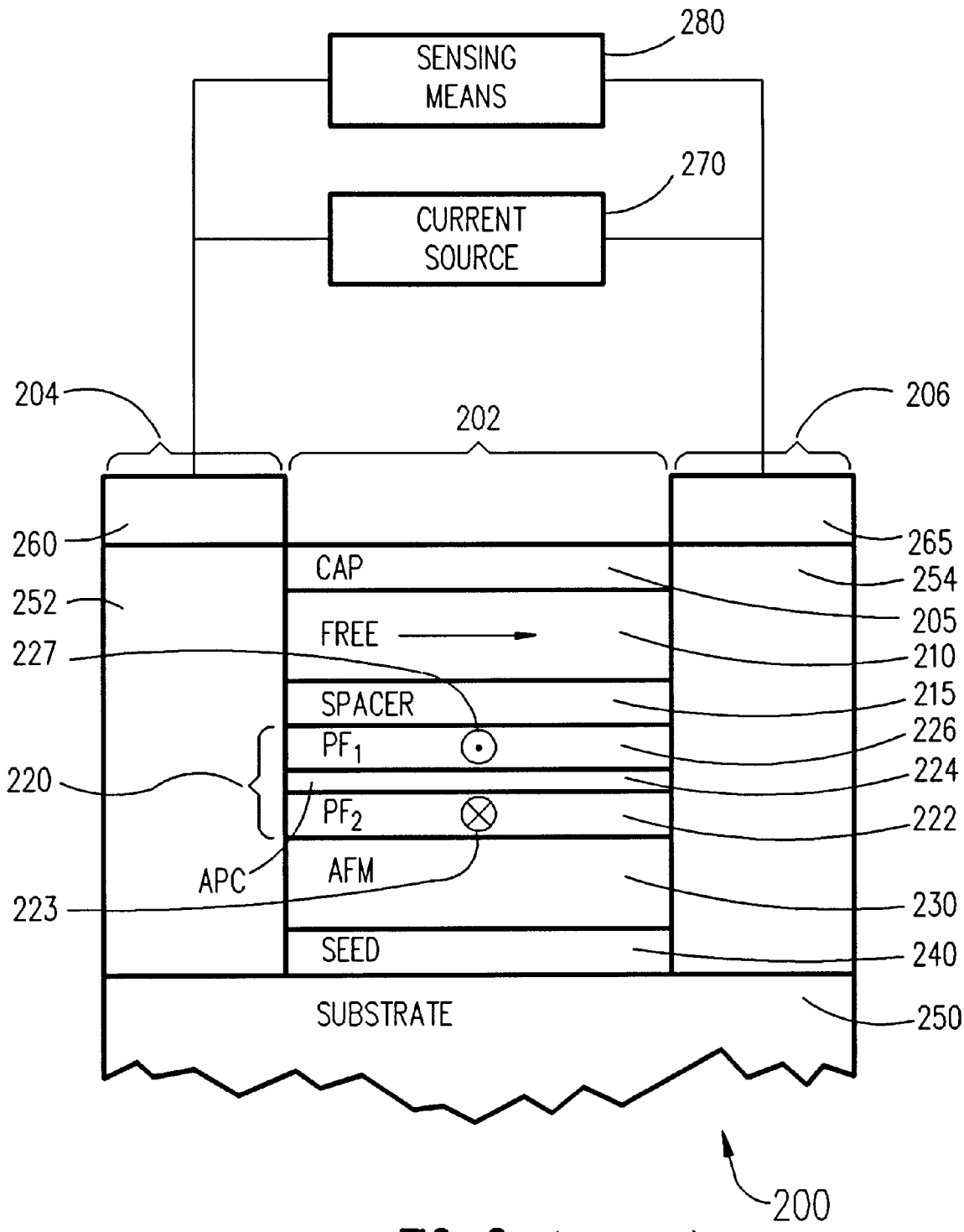
FIG. 2 is an air bearing surface view, not to scale, of a prior art AP-pinned SV sensor.
Figure 3:
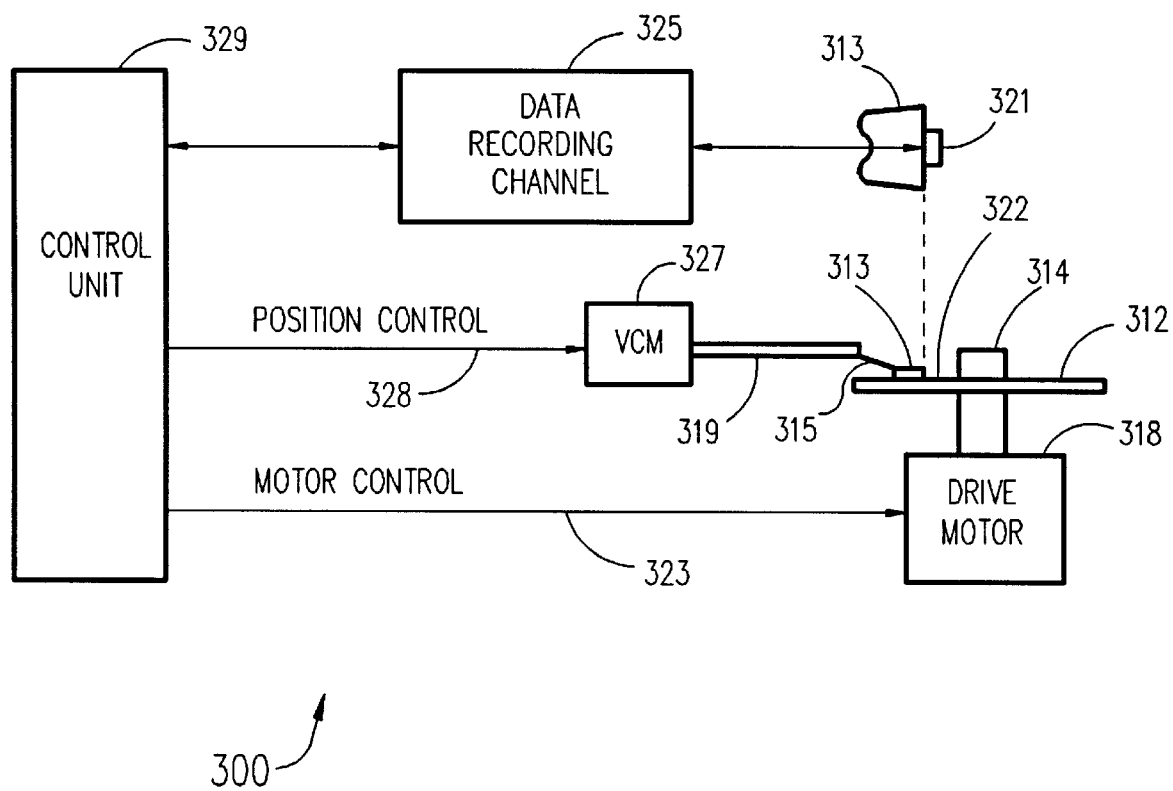
FIG. 3 is a simplified drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
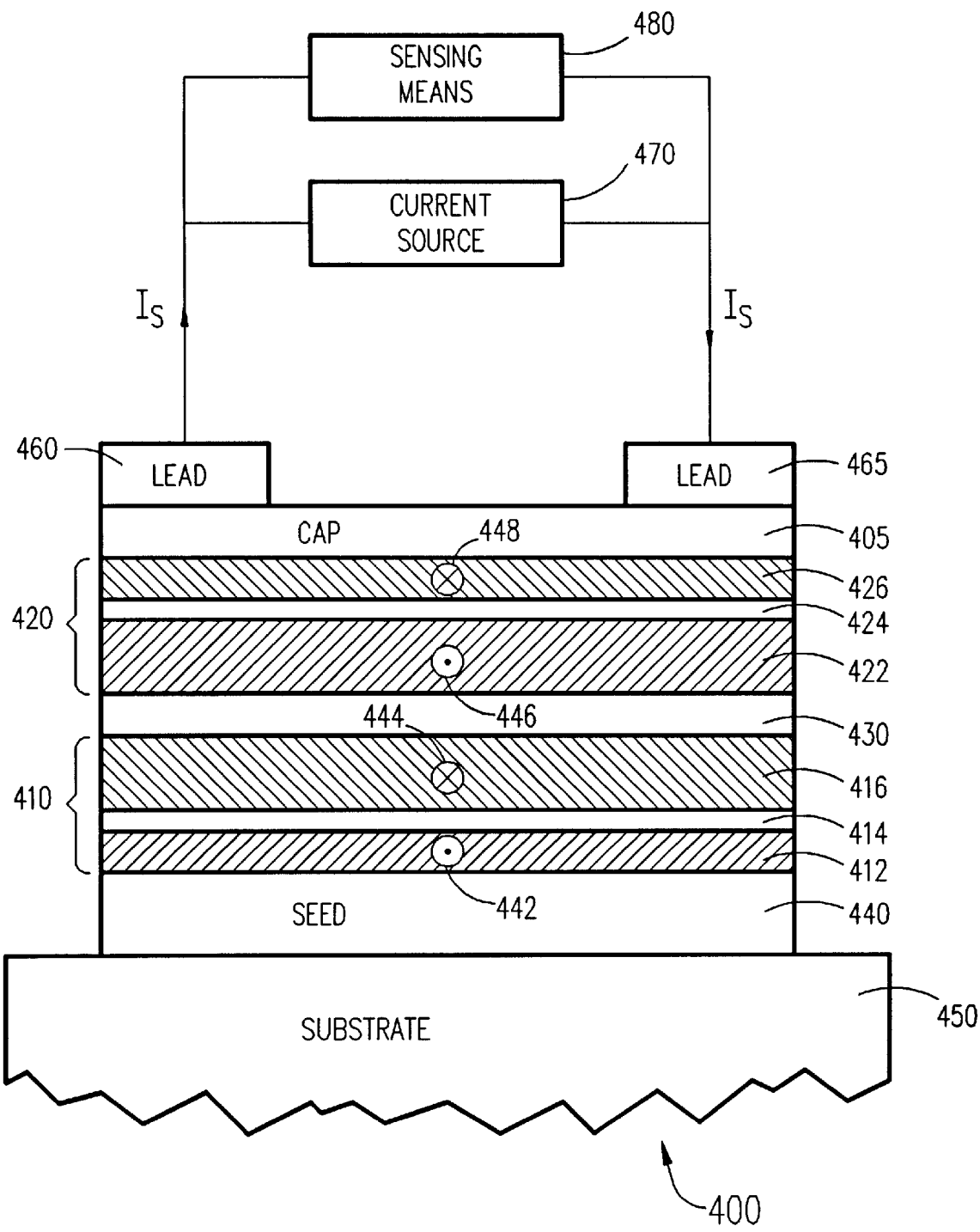
FIG. 4 is an air bearing surface view, not to scale, of the MR sensor according to the present invention.

FIG. 4 shows an air bearing surface (ABS) view of the MR sensor 400 according to the preferred embodiment of the present invention. MR sensor 400 comprises a first laminated free layer 410 and a second laminated free layer 420 separated from each other by a non-magnetic, electrically conducting spacer layer 430. First free layer structure 410 comprises a first ferromagnetic layer 416 and a second ferromagnetic layer 412 separated from each other by an antiparallel coupling (APC) layer 414 that allows the two ferromagnetic layers 412, 416 to be strongly coupled together antiferromagnetically. Second free layer structure 420 comprises a first ferromagnetic layer 422 and a second ferromagnetic layer 426 separated from each other by an APC layer 424 that allows the two ferromagnetic layers 422, 426 to be strongly coupled together antiferromagnetically. In the preferred embodiment, all the ferromagnetic layers are deposited in the presence of an orienting magnetic field to set the preferred magnetizations of the layers perpendicular to the ABS.

The substrate 450 can be any suitable substance, including glass, semiconductor material, or a ceramic material, such as alumina ($Al_2O_3$). The seed layer 440 is any layer deposited to modify the crystallographic texture or grain size of the subsequent layers, and may not be needed depending on the substrate. If used the seed layer may be formed of tantalum (Ta), zirconium (Zr), nickel-iron (Ni—Fe), or $Al_2O_3$. The first free layer structure 410 is formed on the seed layer 440. The second ferromagnetic layer 412 is a layer of magnetically soft (that is, low coercivity) ferromagnetic material such as Ni—Fe deposited on the seed layer 440. The first ferromagnetic layer 416 is a layer of low coercivity ferromagnetic material such as Ni—Fe, or alternatively, a composite layer comprising a first sublayer of soft magnetic material such as Ni—Fe and a second sublayer of thin cobalt (Co) deposited on the first Ni—Fe sublayer where the Co sublayer is in contact with the spacer 430.

The two ferromagnetic layers 412, 416 have their magnetization directions oriented antiparallel, as indicated by arrows 442, 444 (arrow heads pointing out of and in to the plane of the paper, respectively). The antiparallel alignment of the magnetizations of the two ferromagnetic layers 412, 416 is due to an antiferromagnetic exchange coupling through the APC layer 414, preferably formed of a ruthenium (Ru) film having a thickness of about 6 Å. Spacer layer 430 preferably formed of a copper (Cu) film having a thickness in the range of about 5 Å to 40 Å is formed on and in contact with the first ferromagnetic layer 416.

The second free layer structure 420 is formed on the spacer layer 430. The first ferromagnetic layer 422 is preferably made of a low coercivity ferromagnetic material such as Ni—Fe, or alternatively, a composite layer comprising a first sublayer of thin Co deposited on and in contact with the spacer layer 430 and a second sublayer of Ni—Fe deposited on the Co sublayer. The second ferromagnetic layer 426 is preferably made of low coercivity ferromagnetic material such as Ni—Fe. The two ferromagnetic layers 422, 426 have their magnetization directions oriented antiparallel, as indicated by arrows 446, 448. The antiparallel alignment of the magnetizations of the two ferromagnetic layers 422, 426 is due to an antiferromagnetic exchange coupling through the APC layer 424, formed of a Ru film having a thickness of about 6 Å in the preferred embodiment of the present invention. A cap layer 405 formed of a suitable protective material such as tantalum (Ta) or $Al_2O_3$ is deposited on the second laminated free layer 420 to protect the active layers of the MR sensor 400.

Lead layers 460 and 465 are deposited on the end regions of the cap layer 405 to provide electrical connections for the flow of the sensing current $I_s$ from a current source 470 to the GMR sensor 400. Detection circuitry 480 connected to leads 460, 465 sense (detects) the change in resistance due to changes induced in GMR sensor 400 by the external magnetic field (e.g., field generated by a data bit stored on a disk). Detection circuitry 480 includes a digital or analog recording channel such as a partial response maximum likelihood (PRML) channel or a phase detector channel as is well known to those skilled in the art.

In the preferred embodiment of this invention, the first free layer structure 410 and the second free layer structure 420 are symmetrically disposed with respect to each other above and below the spacer layer 430. The second ferromagnetic layer 412 of the first free layer structure 410 has a thickness approximately equal to the thickness of the second ferromagnetic layer 426 of the second free layer structure 420. The first ferromagnetic layer 416 of the first free layer structure 410 has a thickness approximately equal to the thickness of the first ferromagnetic layer 422 of the second free layer structure 420. In the first free layer structure 410, the first ferromagnetic layer 416 has a thickness greater than the thickness of the second ferromagnetic layer 412 so that the net magnetization (magnetic moment) of these antiparallel coupled ferromagnetic layers 412, 416 is determined by the magnetization (magnetic moment) of the first ferromagnetic layer 416 which is in contact with the spacer layer 430. Similarly, in the second free layer structure 420, first ferromagnetic layer 422 has a thickness greater than the thickness of the second ferromagnetic layer 426 so that the net magnetization (magnetic moment) of these antiparallel coupled ferromagnetic layers 422, 426 is determined by the magnetization (magnetic moment) of the first ferromagnetic layer 422 which is in contact with the spacer layer 430. In the preferred embodiment, the first ferromagnetic layers 416, 422 each have a thickness of about 80 Å and the second ferromagnetic layers 412, 426 each have a thickness of about 40 Å.

Figure 5:
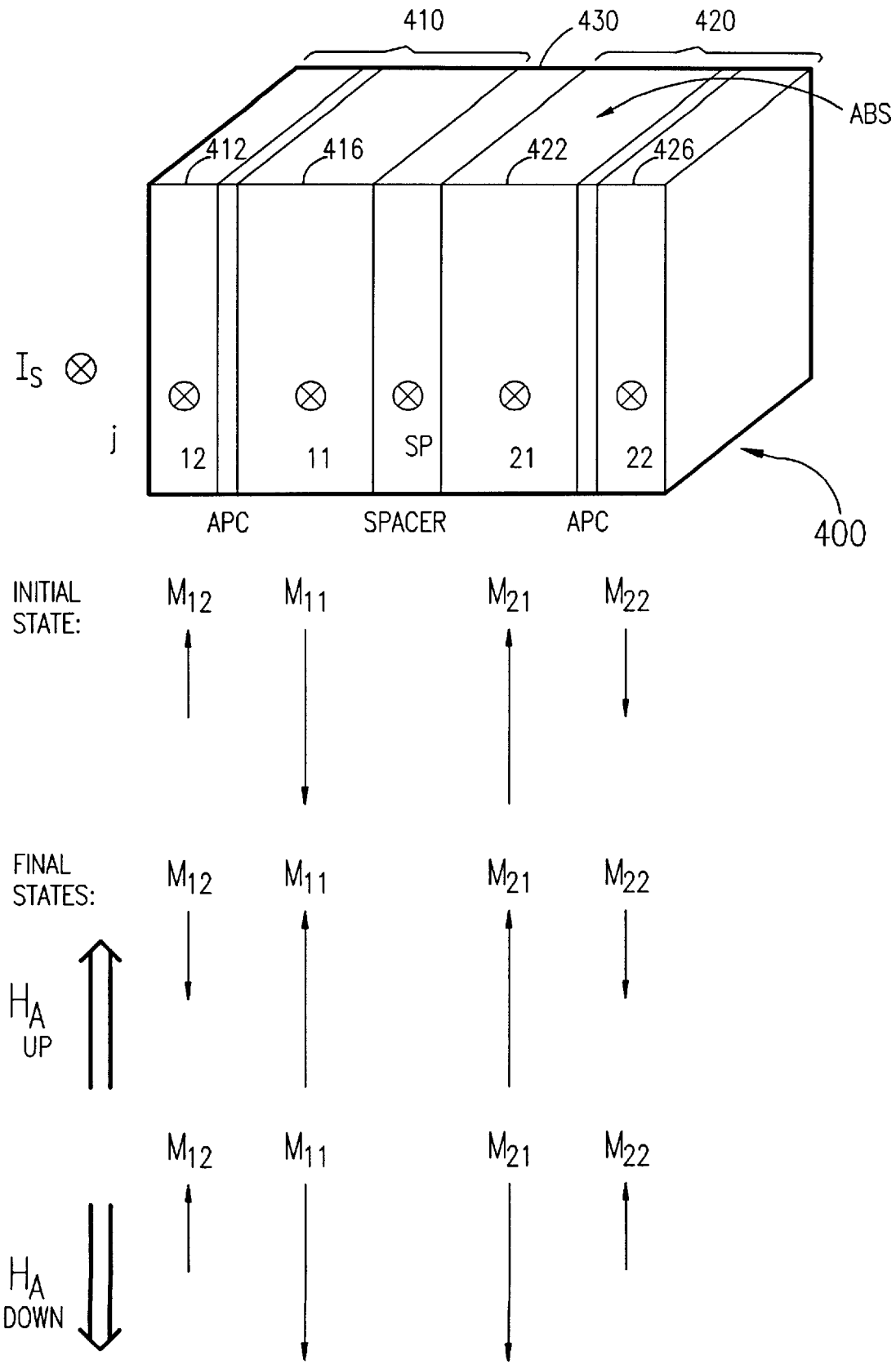
FIG. 5 is a perspective view of the MR sensor illustrating the ferromagnetic layers magnetization directions in the initialized (quiescent) state and in the final states for both polarities of the applied magnetic field.

Referring now to FIG. 5, the operation of the GMR sensor 400 will be described. In the absence of an applied magnetic field, the initial magnetization state of the ferromagnetic layers is set by the magnetic fields induced by the sense current, $I_s$, flowing in the plane of the layers and parallel to the ABS. The sense current $I_s$ is distributed among the conductive layers of GMR sensor 400 with current components $j_{xy}$ flowing in the ferromagnetic layers, where the index x indicates the first or second laminated free layer 410 and 420, respectively, and index y indicates the first or second ferromagnetic layer in each of the laminated free layers. Current component $j_{spacer}$ is the component of $I_s$ flowing in the spacer layer 430. For the first free layer structure 410, the second ferromagnetic layer 412 sees an induced magnetic field directed toward the ABS due to the sum of the current components $j_{11}$, $j_{spacer}$, $j_{21}$ and $j_{22}$ (right hand rule). Because of cancellation of magnetic fields induced by the current components flowing in layers on opposite sides of the first ferromagnetic layer 416, said first ferromagnetic layer 416 sees a much smaller induced magnetic field directed toward the ABS due to the sum of current components $j_{spacer}$ and $j_{21}$. The strong induced magnetic field at the second ferromagnetic layer 412 orients the magnetic moment $M_{12}$ toward the ABS as indicated for the initial state in FIG. 5 (where the indices of $M_{xy}$ have the same meaning as defined above for $j_{xy}$). Because of the strong antiferromagnetic coupling due to APC layer 414, the magnetic moment $M_{11}$ of the first ferromagnetic layer 416 orients away from the ABS. Because of the symmetry of the GMR sensor 400, similar arguments applied to the second free layer structure 420 show that the magnetic moment $M_{22}$ of the second ferromagnetic layer 426 will be directed away from the ABS due to the sense current induced magnetic field, and the magnetic moment $M_{21}$ of the first ferromagnetic layer will be directed toward the ABS because of antiferromagnetic coupling due to APC layer 424. Because of the symmetry of the GMR sensor 400, the demagnetization fields from each ferromagnetic layer will largely cancel at every layer. The net demagnetization field, $H_{demag}$, of the GMR sensor 400 is approximately zero in the initial state due to flux closure.

The magnetic field induced by the sense current components acting on the second ferromagnetic layer 412 is in the range of about 20 to 80 Oe. Because the ferromagnetic layers 412 and 416 are soft ferromagnetic materials, the magnetic coercivity of the antiparallel coupled layers of the first free layer structure 410 is less than 5 Oe. The low coercivity of the first free layer structure 410 allows its magnetizations to be easily rotated by the magnetic field induced by the sense current to a direction perpendicular to the ABS. Similarly, the magnetizations of second free layer structure 420 are oriented perpendicular to the ABS, but in opposite directions relative to the first free layer structure 410.

In the initial (quiescent) state, the magnetic moments $M_{11}$, $M_{21}$ of the first ferromagnetic layers 416, 422, respectively, are oriented anti-parallel with respect to each other. The two first ferromagnetic layers 416, 422 are adjacent to and in contact with the spacer layer 430 and are therefore the active ferromagnetic layers with respect to the GMR effect in the GMR sensor 400. The anti-parallel orientation of $M_{11}$ and $M_{21}$ corresponds to the high resistance state of the GMR sensor 400 (point 'A' on the transfer function shown in FIG. 6a).

The applied magnetic field, $H_A$, due to a data bit on the magnetic disk, is in the range of about 20 to 60 Oe and has approximately the same magnitude at every layer of GMR sensor 400. Referring again to FIG. 5, if a magnetic field $H_A$ is applied in the direction toward the ABS, the field $H_A$ will act on the net magnetic moment of the first free layer structure 410 to rotate the net magnetic moment toward the ABS resulting in the final state magnetic moment orientations indicated for $H_A$ up. Similarly, if a magnetic field, $H_A$, is applied in the direction away from the ABS, the net magnetic moment of the second free layer structure 420 will be rotated toward the ABS resulting in the final state moment orientations indicated for $H_A$ down. For both final states, the orientations of the magnetic moments $M_{11}$ and $M_{21}$ of first ferromagnetic layers 416 and 422 are parallel to each other corresponding to the low resistance states of the GMR sensor 400 (points 'B' and 'C' on the transfer function shown in FIG. 6a). It can therefore be seen that the GMR sensor 400 produces a unipolar delta R/R output response during transitions from a first low resistance state to a second low resistance state as the applied magnetic field HA switches direction.

Figure 6A:
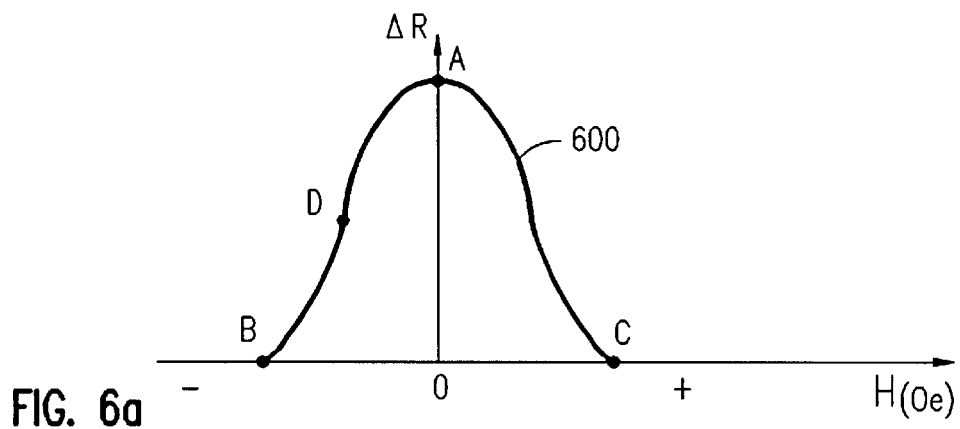
FIG. 6a is the transfer curve (resistance versus applied magnetic field) for an MR sensor (not to scale)

FIG. 6a shows the transfer function 600 (resistance plotted as a function of magnetic field), not to scale, for the MR sensor of the present invention. The transfer function 600 is a bell-shaped curve similar to the transfer function of a typical AMR sensor used in the data storage industry. In the absence of a magnetic field from the disk, the MR sensor is in the high resistance state (point marked 'A'). When a magnetic field from the disk is applied with either positive polarity or negative polarity, the resistance decreases to the points 'C' or 'B', respectively.

Figure 6B:
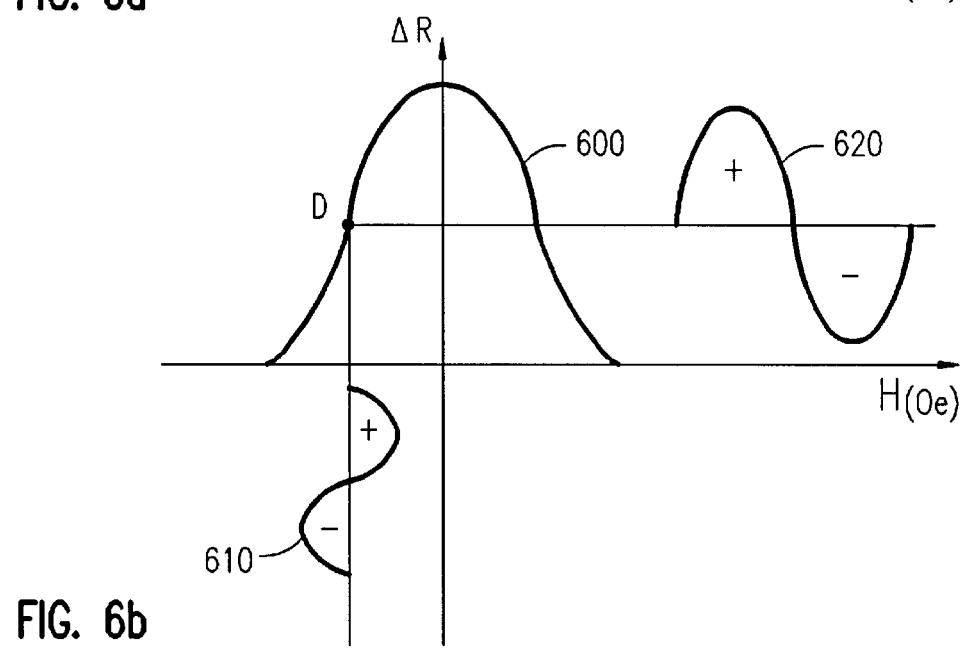
FIGS. 6b and 6c are the transfer curves (not to scale) at the operating (bias) points for an SV sensor and for the MR sensor of the present invention, respectively.

FIG. 6b shows the transfer function 600 (not to scale) at the operating point used for a typical AMR sensor. A bias magnetic field is applied so that the bias (quiescent) point on the transfer curve 600 is at point 'D'. A bipolar magnetic field input 610 results in a bipolar magnetoresistance output 620 because of the linearity of the transfer function 600 around point 'D'.

Figure 6C:
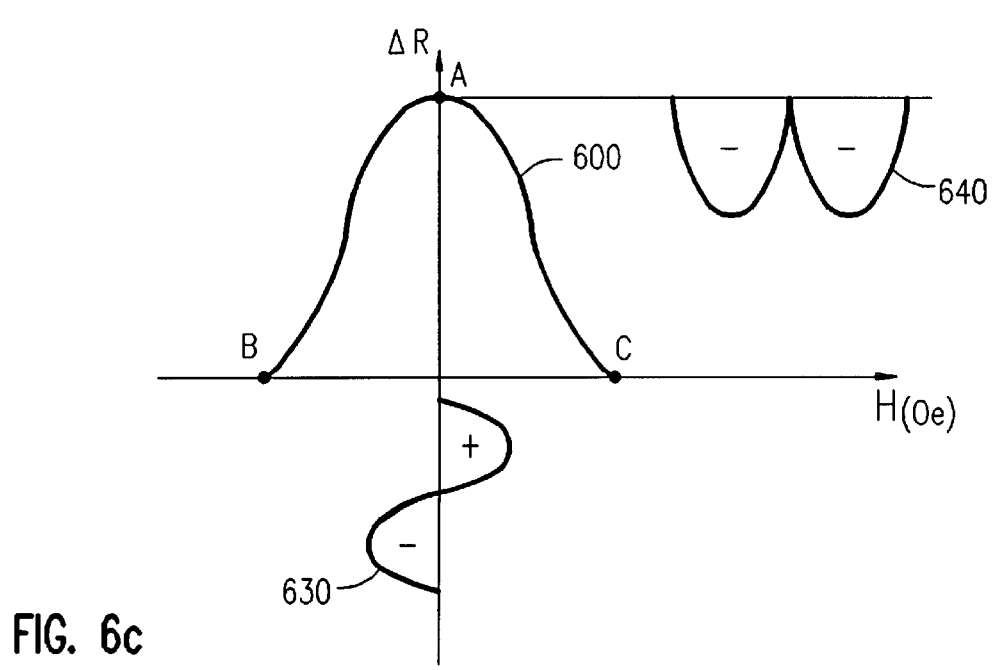

FIG. 6c shows the transfer function 600 (not to scale) at the operating point of the MR sensor of the present invention. With no magnetic field applied from the disk, the sensor is in the high resistance state corresponding to the bias (quiescent) point at point 'A'. A bipolar magnetic field input 630 results in a unipolar magnetoresistance output 640 because the transfer function 600 has its maximum value at point 'A'. For a sufficiently large positive or negative applied magnetic field from the disk, the magnetoresistance output will decrease to the low resistance state values at point 'C' and point 'B', respectively.

In the preferred embodiment of the MR sensor 400 of the present invention, a small net magnetic moment and low coercivity of the first and second free layer structures are desirable. Low coercivity is attained by the use of Ni—Fe layers for the ferromagnetic layers and by limiting the Co sublayers to having thickness in the range of about 2 Å to 20 Å if used in the alternative composite first ferromagnetic layers 416 and 422. The antiparallel alignment of the first and second ferromagnetic layers in each of the free layer structures reduces the net magnetic moment by cancellation of the magnetic moments of equivalent thicknesses of the ferromagnetic layers. The optimum net magnetic moment of the free layer structures 410 and 420 is a function of the linear bit density of the recorded data, becoming smaller as the linear bit density increases. Net magnetic moments of the free layer structures equivalent to Ni—Fe layer thicknesses ranging from 5 Å to 70 Å are desirable.

The relative thickness of the first and second ferromagnetic layers included in each of the free layer structures 410 and 420 determines the net magnetic moments and therefore the ability to switch the magnetic state of the GMR sensor 400 with an applied magnetic field, $H_A$. A ratio of first ferromagnetic layer thickness to second ferromagnetic layer thickness that yields magnetic moment ratios $M_{11}/M_{12}$ and $M_{21}/M_{22}$ in the approximate range from 1/1 to 3/1 are preferred ratios.

As linear bit densities of magnetic recording systems increase in order to achieve high areal densities of data storage, the thickness of the MR sensor must decrease to allow resolution of the smaller data bits. Elimination of the need for an AFM layer to pin the magnetization of a reference ferromagnetic layer in current SV sensors, significantly decreases the thickness of the GMR sensor of the present invention. While a thinner detection layer is required for higher linear density recording, the GMR coefficient begins to decrease as ferromagnetic layers become thinner. The present invention allows a thinner detection layer which is determined by the net magnetic moments of the free layer structures 410, 420 while individual layers can be kept thicker to maintain high GMR coefficient.

It will be apparent to those skilled in the art that all the ferromagnetic layers in GMR sensor 400 may be deposited in the presence of an orienting magnetic field to set the preferred magnetizations of the layers parallel to the ABS to fabricate GMR sensors according to the present invention.

It will also be apparent to those skilled in the art that alternative spacer layer 430 materials such as gold and silver may also be used to fabricate GMR sensors according to the present invention.

It will be further apparent to those skilled in the art that alternative anti-parallel coupling (APC) layer 414, 424 materials such as indium and rhodium may also be used to fabricate GMR sensors according to the present invention.

While the present invention has been particularly shown and described with reference to the preferred embodiments, it will be understood by those skilled in the art that various changes in form and detail may be made without departing from the spirit, scope and teaching of the invention. Accordingly the disclosed invention is to be considered merely as illustrative and limited in scope only as specified in the appended claims.

We claim:

1. A magnetoresistive sensor, comprising:
   a first laminated free layer, said first laminated free layer comprising:
     a first ferromagnetic layer;
     a second ferromagnetic layer; and
     an antiparallel coupling layer disposed between and in contact with said first and second ferromagnetic layers;
   a second laminated free layer, said second laminated free layer comprising:
     a first ferromagnetic layer;
     a second ferromagnetic layer; and
     an antiparallel coupling layer disposed between and in contact with said first and second ferromagnetic layers; and
   a non-magnetic electrically conducting spacer layer disposed between and in contact with said first and second free laminated layers.

2. The magnetoresistive sensor as recited in claim 1 wherein the magnetization directions for said first and second laminated free layers are set by a sense current flowing in said free layers.

3. The magnetoresistive sensor as recited in claim 1 wherein said spacer layer is in contact with said first ferromagnetic layer in said first laminated free layer and with said first ferromagnetic layer in said second laminated free layer.

4. The magnetoresistive sensor as recited in claim 3 wherein the thickness of the first ferromagnetic layer in said second laminated free layer is greater than the thickness of the second ferromagnetic layer in said second laminated free layer.

5. The magnetoresistive sensor as recited in claim 1 wherein said spacer layer is made of copper.

6. The magnetoresistive sensor as recited in claim 1 wherein said spacer layer material is selected from a group of material consisting of gold and silver.

7. The magnetoresistive sensor as recited in claim 1 wherein said antiparallel coupling layer is made of Ru.

8. The magnetoresistive sensor as recited in claim 1 wherein said antiparallel coupling layer is selected from a group of material consisting of Ir and Rh.

9. The magnetoresistive sensor as recited in claim 1 wherein said first and second ferromagnetic layers in said first and second laminated free layers are made of Ni—Fe.

10. The magnetoresistive sensor as recited in claim 1 wherein each of said first ferromagnetic layers in said first and second laminated free layers include a first ferromagnetic sublayer of Ni—Fe and a second ferromagnetic sublayer of cobalt.

11. A magnetoresistive (MR) sensor having no antiferromagnetic layer and no ferromagnetic pinned layer, said MR sensor comprising:
   a first laminated free layer, said first laminated free layer comprising:
     a first ferromagnetic layer;
     a second ferromagnetic layer; and
     an antiparallel coupling layer disposed between and in contact with said first and second ferromagnetic layers;
   a second laminated free layer, said second laminated free layer comprising:
     a first ferromagnetic layer;
     a second ferromagnetic layer; and
     an antiparallel coupling layer disposed between and in contact with said first and second ferromagnetic layers; and
   a non-magnetic electrically conducting spacer layer disposed between and in contact with said first and second free laminated layers.

12. The MR sensor as recited in claim 11 wherein the magnetization directions for said first and second laminated free layers are set by a sense current flowing in said free layers.

13. The MR sensor as recited in claim 11 wherein said spacer layer is in contact with first ferromagnetic layer in said first laminated free layer and with first ferromagnetic layer in said second laminated free layer.

14. The MR sensor as recited in claim 13 wherein the thickness of the first ferromagnetic layer in said second laminated free layer is greater than the thickness of the second ferromagnetic layer in said second laminated free layer.

15. The MR sensor as recited in claim 11 wherein said spacer layer is made of copper.

16. The MR sensor as recited in claim 11 wherein said spacer layer material is selected from a group of material consisting of gold and silver.

17. The MR sensor as recited in claim 11 wherein said antiparallel coupling layer is made of Ru.

18. The magnetoresistive sensor as recited in claim 1 wherein said antiparallel coupling layer is selected from a group of material consisting of Ir and Rh.

19. The magnetoresistive sensor as recited in claim 11 wherein said first and second ferromagnetic layer in said first and second laminated free layers are made of Ni—Fe.

20. The magnetoresistive sensor as recited in claim 11 wherein each of said first ferromagnetic layers in said first and second laminated free layers include a first ferromagnetic sublayer of Ni—Fe and a second ferromagnetic sublayer of cobalt.

21. A disk drive system, comprising:
a magnetic recording disk;
a magnetoresistive (MR) sensor for sensing magnetically recorded data on said disk, the MR sensor comprising:
a first laminated free layer, said first laminated free layer comprising:
a first ferromagnetic layer;
a second ferromagnetic layer; and
an antiparallel coupling layer disposed between and in contact with said first and second ferromagnetic layers;
a second laminated free layer, said second laminated free layer comprising:
a first ferromagnetic layer;
a second ferromagnetic layer; and
an antiparallel coupling layer disposed between and in contact with said first and second ferromagnetic layers; and
a non-magnetic electrically conducting spacer layer disposed between and in contact with said first and second free laminated layers;
an actuator for moving said MR sensor across the magnetic recording disk; and
a detection circuitry electrically coupled to said MR sensor for detecting changes in resistance of the MR sensor caused by rotation of the magnetization axes of the first and second laminated free layers in response to magnetic fields from the magnetically recorded data.

22. The disk drive system as recited in claim 21 wherein the magnetization directions for said first and second laminated free layers are set by a sense current flowing in said free layers.

23. The disk drive system as recited in claim 21 wherein said spacer layer is in contact with said first ferromagnetic layer in said first laminated free layer and with said first ferromagnetic layer in said second laminated free layer.

24. The disk drive system as recited in claim 23 wherein the thickness of the first ferromagnetic layer in said second laminated free layer is greater than the thickness of the second ferromagnetic layer in said second laminated free layer.

25. The disk drive system as recited in claim 21 wherein said spacer layer is made of copper.

26. The disk drive system as recited in claim 21 wherein said spacer layer material is selected from a group of material consisting of gold and silver.

27. The disk drive system as recited in claim 21 wherein said antiparallel coupling layer is made of Ru.

28. The disk drive system as recited in claim 21 wherein said antiparallel coupling layer is selected from a group of material consisting of Ir and Rh.

29. The disk drive system as recited in claim 21 wherein said first and second ferromagnetic layers in said first and second laminated free layers are made of Ni—Fe.

30. The disk drive system as recited in claim 31 wherein each of said first ferromagnetic layers in said first and second laminated free layers include a first ferromagnetic sublayer of Ni—Fe and a second ferromagnetic sublayer of cobalt.

31. A disk drive system, comprising:
a magnetic recording disk;
a magnetoresistive (MR) sensor having no antiferromagnetic layer and no ferromagnetic pinned layer, said MR sensor comprising:
a first laminated free layer, said first laminated free layer comprising:
a first ferromagnetic layer;
a second ferromagnetic layer; and
an antiparallel coupling layer disposed between and in contact with said first and second ferromagnetic layers;
a second laminated free layer, said second laminated free layer comprising:
a first ferromagnetic layer;
a second ferromagnetic layer; and
an antiparallel coupling layer disposed between and in contact with said first and second ferromagnetic layers; and
a non-magnetic electrically conducting spacer layer disposed between and in contact with said first and second free laminated layers;
an actuator for moving said MR sensor across the magnetic recording disk; and
a detection circuitry electrically coupled to said MR sensor for detecting changes in resistance of the MR sensor caused by rotation of the magnetization axes of the first and second laminated free layers in response to magnetic fields from the magnetically recorded data.

32. The disk drive system as recited in claim 31 wherein the magnetization directions for said first and second laminated free layers are set by a sense current flowing in said free layers.

33. The disk drive system as recited in claim 31 wherein said spacer layer is in contact with said first ferromagnetic layer in said first laminated free layer and with said first ferromagnetic layer in said second laminated free layer.

34. The disk drive system as recited in claim 33 wherein the thickness of the first ferromagnetic layer in said second laminated free layer is greater than the thickness of the second ferromagnetic layer in said second laminated free layer.

35. The disk drive system as recited in claim 31 wherein said spacer layer is made of copper.

36. The disk drive system as recited in claim 31 wherein said spacer layer material is selected from a group of material consisting of gold and silver.

37. The disk drive system as recited in claim 31 wherein said antiparallel coupling layer is made of Ru.

38. The disk drive system as recited in claim 31 wherein said antiparallel coupling layer is selected from a group of material consisting of Ir and Rh.

39. The disk drive system as recited in claim 31 wherein said first and second ferromagnetic layers in said first and second laminated free layers are made of Ni—Fe.

40. The disk drive system as recited in claim 31 wherein each of said first ferromagnetic layers in said first and second laminated free layers include a first ferromagnetic sublayer of Ni—Fe and a second ferromagnetic sublayer of cobalt.

* * * * *